(12) United States Patent
Takahashi

(10) Patent No.: US 12,130,653 B2
(45) Date of Patent: Oct. 29, 2024

(54) DELAY TIME DETECTION CIRCUIT, STAMPING INFORMATION GENERATION DEVICE, AND DELAY TIME DETECTION METHOD

(71) Applicant: NEC Platforms, Ltd., Kawasaki (JP)

(72) Inventor: Masayuki Takahashi, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 649 days.

(21) Appl. No.: 17/289,509

(22) PCT Filed: Aug. 26, 2019

(86) PCT No.: PCT/JP2019/033300
§ 371 (c)(1),
(2) Date: Apr. 28, 2021

(87) PCT Pub. No.: WO2020/100374
PCT Pub. Date: May 22, 2020

(65) Prior Publication Data
US 2021/0397211 A1  Dec. 23, 2021

(30) Foreign Application Priority Data

Nov. 12, 2018 (JP) .................................. 2018-212047

(51) Int. Cl.
| G06F 1/04 | (2006.01) |
| G04C 13/02 | (2006.01) |
| G04F 10/06 | (2006.01) |
| H03K 5/01 | (2006.01) |
| H03K 21/02 | (2006.01) |
| H03K 5/00 | (2006.01) |

(52) U.S. Cl.
CPC ............ *G06F 1/04* (2013.01); *G04C 13/023* (2013.01); *G04F 10/06* (2013.01); *H03K 5/01* (2013.01);
(Continued)

(58) Field of Classification Search
CPC ......... G06F 1/04; G04C 13/023; G04F 10/06; H03K 5/01; H03K 21/02; H03K 2005/00013
See application file for complete search history.

(56) References Cited

U.S. PATENT DOCUMENTS 4,168,467 A  9/1979  Bailey et al.
9,379,714 B1  6/2016  Xiu
(Continued)

FOREIGN PATENT DOCUMENTS

CN  106899290 A  6/2017
JP  S5390973 A  8/1978
(Continued)

OTHER PUBLICATIONS

Extended European Search Report for EP Application No. EP19884785.7 dated on Jun. 8, 2022.
(Continued)

*Primary Examiner* — Mohamed Charioui
*Assistant Examiner* — Lynda Dinh

(57) ABSTRACT

A delay time detection circuit includes below configurations. A clock generation unit generates a sub scale clock signal, based on a system clock signal. A count unit generates a count signal while sequentially and repeatedly incrementing a count number, based on the sub scale clock signal. A sub scale signal generation unit receives the count signal, and generates sub scale signals, equal in number to the count number, that each have, at a rate of once in the count number, a rectangular wave for a duration being associated with a second period and that are shifted in timing relative to one another according to the second period. A delay time calculation unit receives the input clock signal, and calculates a delay time within a range of the first period of the input
(Continued)

clock signal with respect to the system clock signal, based on one of the sub scale signals.

6 Claims, 12 Drawing Sheets

(52) U.S. Cl.
CPC ... *H03K 21/02* (2013.01); *H03K 2005/00013* (2013.01)

(56) References Cited

U.S. PATENT DOCUMENTS

| | | | |
|---|---|---|---|
| 2003/0223523 A1* | 12/2003 | Takaki | G06F 1/12 375/354 |
| 2008/0129574 A1 | 6/2008 | Choi et al. | |
| 2011/0316816 A1* | 12/2011 | Okuma | G09G 3/3688 345/204 |
| 2018/0088536 A1 | 3/2018 | Kurashina et al. | |

FOREIGN PATENT DOCUMENTS

| | | | |
|---|---|---|---|
| JP | S6017389 A | | 1/1985 |
| JP | H05333169 | * | 12/1993 |
| JP | H05333169 A | | 12/1993 |
| JP | 2002196087 A | | 7/2002 |
| JP | 2008131659 A | | 6/2008 |
| JP | 2018054352 A | | 4/2018 |
| WO | 2017/197946 A1 | | 11/2017 |

OTHER PUBLICATIONS

International Search Report of PCT Application No. PCT/JP2019/033300 mailed Oct. 8, 2019.

* cited by examiner

DELAY TIME DETECTION CIRCUIT, STAMPING INFORMATION GENERATION DEVICE, AND DELAY TIME DETECTION METHOD

This application is a National Stage Entry of PCT/JP2019/033300 filed on Aug. 26, 2019, which claims priority from Japanese Patent Application 2018-212047 filed on Nov. 12, 2018, the contents of all of which are incorporated herein by reference, in their entirety.

TECHNICAL FIELD

The present invention relates to a delay time detection circuit, a stamping information generation device, and a delay time detection method.

BACKGROUND ART

A technique called precision time protocol (PTP) is widely adopted for a time synchronization device that executes time synchronization protocol. The PTP is a standard specification (IEEE1588v2) recommended by the Institute of Electrical and Electronics Engineers (IEEE). A plurality of devices put in a network environment such as Ethernet (registered trademark) can perform time synchronization with high accuracy by adopting the PTP.

In the above-described network environment, a difference may be made between times of a transmission delay on an uplink line and a transmission delay on a downlink line. As a method for suppressing deterioration of accuracy resulting from such an event, the IEEE1588v2 recommends a transparent clock (TC) function.

Meanwhile, even when the TC function is used, further improving stamping accuracy made in each device is expected. As a technique for improving stamping accuracy, a circuit utilizing, in addition to a first period corresponding to a main scale, a second period corresponding to a sub scale is known.

For example, a circuit device described in Patent Literature 1 includes a time digital conversion circuit to which a first clock signal having a first clock period and a second clock signal having a second clock period differing from the first clock period are input. Moreover, the circuit device includes a phase-locked loop (PLL) circuit that performs phase synchronization of the first and second clock signals.

A time-to-digital converter in Patent Literature 2 includes a low-resolution time-to-digital converter and a high-resolution time-to-digital converter. The low-resolution time-to-digital converter measures a time difference between a first signal and a second signal at a first quantization interval. The high-resolution time-to-digital converter measures a time difference between the first signal and the second signal at a second quantization interval smaller than the first quantization interval.

CITATION LIST

Patent Literature

[Patent Literature 1] Japanese Unexamined Patent Application Publication No. 2018-054352

[Patent Literature 2] Japanese Unexamined Patent Application Publication No. 2008-131659

SUMMARY OF INVENTION

Technical Problem

However, the circuit device described in Patent Literature 1 needs to perform phase synchronization, and is not preferable as a circuit that transmits stamping information. The technique described in Patent Literature 2 needs to include a high-resolution timestamp function, and leads to increase of a circuit scale and cost.

In view of the above-described problems, an object of the present disclosure is to provide a circuit and the like that generate high-accuracy time information by a simple logic circuit.

Solution to Problem

A delay time detection circuit according to one example embodiment includes a clock generation unit, a count unit, a sub scale signal generation unit, and a delay time calculation unit. The clock generation unit generates a sub scale clock signal, based on a system clock signal. The count unit generates a count signal while sequentially and repeatedly incrementing a preset count number, based on the sub scale clock signal. The sub scale signal generation unit receives the count signal, and generates sub scale signals, equal in number to the count number, that each have, at a rate of once in the count number, a rectangular wave for a duration being associated with a second period and that are shifted in timing relative to one another according to the second period. The delay time calculation unit receives a input clock signal, and calculates a delay time within a range of the first period of the input clock signal with respect to the system clock signal, based on one of the sub scale signals having a timing coinciding with the input clock signal among a plurality of the sub scale signals. The delay time calculation unit processes, as a timing coinciding with the input clock signal, either a case where two or more rising edges of the input clock signal are included within a duration being associated with the second period of the rectangular wave, or a case where two or more falling edges of the input clock signal are included within a duration being associated with the second period of the rectangular wave.

A delay time detection method according to one example embodiment includes a clock generation step, a count step, a sub scale signal generation step, and a delay time calculation step. The clock generation step generates a sub scale clock signal, based on a system clock signal. The count step generates a count signal while sequentially and repeatedly incrementing a preset count number, based on the sub scale clock signal. The sub scale signal generation step receives the count signal, and generates sub scale signals, equal in number to the count number, that each have, at a rate of once in the count number, a rectangular wave for a duration being associated with a second period and that are shifted in timing relative to one another according to the second period. The delay time calculation step receives an input clock signal, and calculates a delay time within a range of the first period of the input clock signal with respect to the system clock signal, based on one of the sub scale signals having a timing coinciding with the input clock signal among a plurality of the sub scale signals. The delay time calculation step processes, as a timing coinciding with the input clock signal, either a case where two or more rising edges of the input clock signal are included within a duration being associated with the second period of the rectangular wave, or a case where two or more falling edges of the input clock signal are included within a duration being associated with the second period of the rectangular wave.

Advantageous Effects of Invention

The present disclosure is able to provide a device that generates high-accuracy time information by a simple logic circuit.

DESCRIPTION OF EMBODIMENTS

For clarification of description, the following description and drawings are suitably subjected to omission and simplification. In each of the drawings, the same reference sign is given to the same element, and repeated description is omitted as needed.

First Example Embodiment

Hereinafter, a first example embodiment is described in detail with reference to the drawings.

A delay time detection circuit according to the first example embodiment is a circuit that detects a delay time of an input clock signal having a first period with respect to a system clock signal by use of the system clock signal corresponding to a main scale and having a first period, and a sub scale clock signal having a second period. Herein, a period (first period) of the system clock signal corresponding to the main scale differs from a period (second period) of the sub scale clock signal corresponding to a sub scale. The delay time detection circuit exerts the above-described function by being built in a device or the like that exchange information by utilizing time information.

Figure 1:
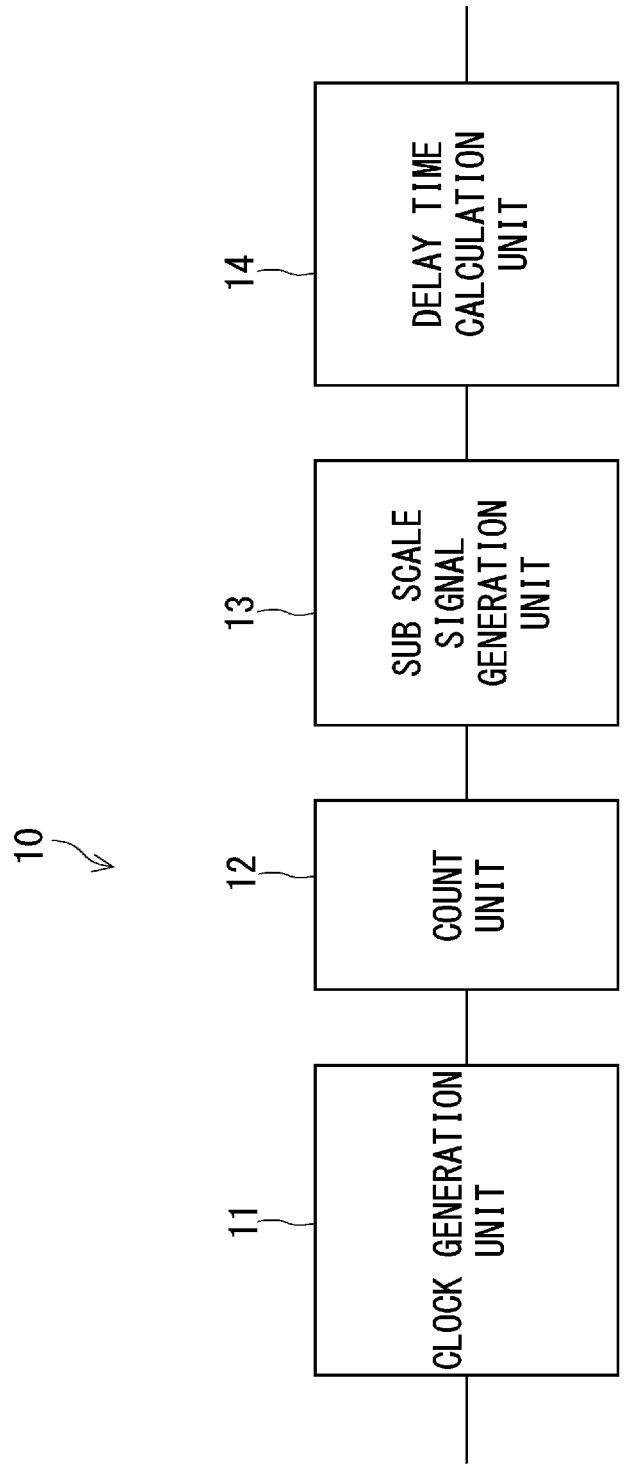
FIG. 1 is a schematic configuration diagram of a delay time detection circuit according to a first example embodiment.

FIG. 1 is a schematic configuration diagram of the delay time detection circuit according to the first example embodiment. A delay time detection circuit 10 illustrated in the Figure includes, as chief components, a clock generation unit 11, a count unit 12, a sub scale signal generation unit 13, and a delay time calculation unit 14.

The clock generation unit 11 acquires a system clock signal, and generates, from the acquired system clock signal, a sub scale clock signal corresponding to a sub scale. The clock generation unit 11 includes a PLL circuit that generates a sub scale clock signal from a system clock signal. The clock generation unit 11 supplies the sub scale clock signal to the count unit 12.

The count unit 12 receives a sub scale clock signal from the clock generation unit 11, and generates a count signal from the received sub scale clock signal. The count unit 12 sequentially and repeatedly increments a preset count number, and, when the preset count number is reached, generates a count signal by again sequentially incrementing a count number from an initial value. The count unit 12 supplies the generated count signal to the sub scale signal generation unit 13.

The sub scale signal generation unit 13 receives a count signal from the count unit 12, and generates, from the received count signal, a sub scale signal being associated with the count signal. The sub scale signal is a plurality of signals that each have, at a rate of once in the count number of the count signal, a rectangular wave for a duration being associated with a second period and that are shifted in timing relative to one another according to the second period. The sub scale signal generation unit 13 generates sub scale signals equal in number to the count number, and supplies the generated sub scale signals to the delay time calculation unit 14.

The delay time calculation unit 14 receives an input clock signal, detects one sub scale signal having a timing coinciding with the input clock signal among a plurality of sub scale signals, and calculates, from the detected sub scale signal, a delay time of the input clock signal with respect to the system clock signal. The delay time calculated by the delay time calculation unit 14 becomes a time within a range of a first period being a period of the system clock signal. The delay time calculation unit 14 outputs the generated delay time. The delay time calculation unit 14 processes, as a timing coinciding with the input clock signal, either a case where two or more rising edges of the input clock signal are included within a duration being associated with the second period of a rectangular wave, or a case where two or more falling edges of the input clock signal are included within a duration being associated with the second period of the rectangular wave.

With such a configuration, the delay time detection circuit 10 according to the first example embodiment detects a delay time of an input clock signal being a time shorter than a period of a system clock corresponding to a main scale. Therefore, the first example embodiment can provide a device that generates high-accuracy time information by a simple logic circuit.

Second Example Embodiment

Hereinafter, a second example embodiment is described with reference to the drawings. A delay time detection circuit according to the second example embodiment is a circuit for acquiring time information by use of a sub scale being a time scale shorter than a period of a system clock being a main scale in a device utilizing time information. The delay time detection circuit exerts the above-described function by being built in a device or the like that exchange information by utilizing time information.

Figure 2:
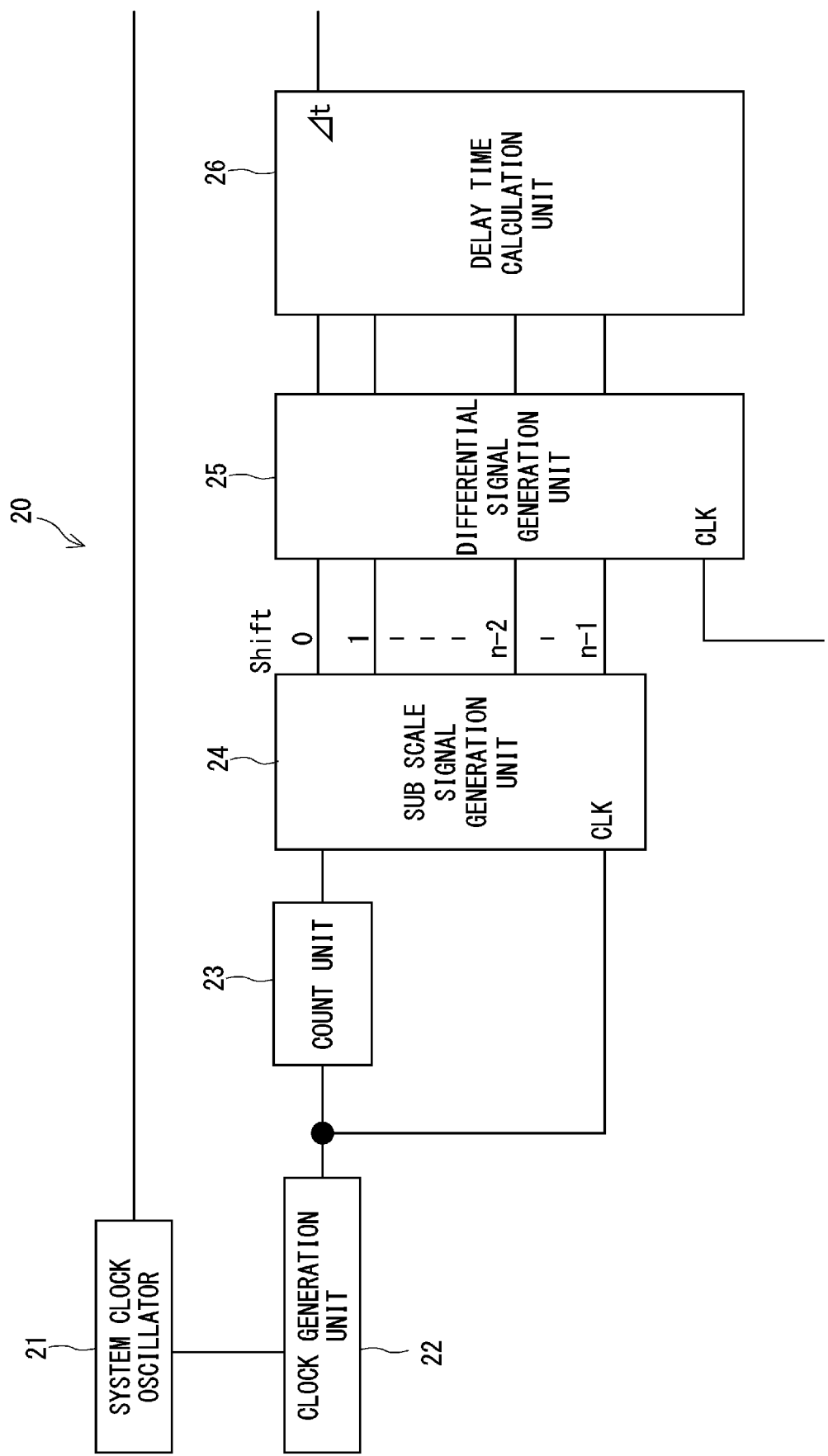
FIG. 2 is a schematic configuration diagram of a delay time detection circuit according to a second example embodiment.

FIG. 2 is a schematic configuration diagram of the delay time detection circuit according to the second example embodiment. A delay time detection circuit 20 illustrated in the Figure includes, as chief components, a clock generation unit 22, a count unit 23, a sub scale signal generation unit 24, a differential signal generation unit 25, and a delay time calculation unit 26. A system clock oscillator 21 that is connected to the delay time detection circuit 20 generates a system clock.

The clock generation unit 22 is a circuit that receives a system clock signal having a preset period, and generates, from the received system clock signal, a clock signal having a period differing from a period of a system clock. More specifically, the clock generation unit 22 includes a circuit called a PLL or a phase synchronization circuit. Note that a period of the system clock signal is referred to as a first period. A clock signal generated by the clock generation unit 22 is referred to as a sub scale clock signal, and a period of the sub scale clock signal is referred to as a second period. The clock generation unit 22 receives a system clock signal of a first period from the system clock oscillator 21, and generates a sub scale clock signal having a second period from the system clock signal. In a case of an example illustrated in the present example embodiment, the second period is a period differing from the second period, and is longer than the first period and shorter than a period twice the first period.

In the present example embodiment, the first period is, for example, 8 nanoseconds (8 ns), and the second period is, for example, 8.75 nanoseconds (8.75 ns). When each of the periods is put into a frequency of a clock signal, a frequency of a system clock signal is 125 MHz, and a frequency of a sub scale clock signal is 114.286 MHz being lower than the frequency of the system clock signal. The clock generation unit 22 supplies the generated sub scale clock signal to each of the count unit 23 and the sub scale signal generation unit 24.

The count unit 23 is a counter circuit that receives a sub scale clock signal, and sequentially and repeatedly increments a preset count number every second period. A count number is a value determined from a value of first period of the system clock signal and a value of a second period of the sub scale clock signal in order to generate a later-described sub scale signal. More specifically, the count unit 23 sets, as a count number, a minimum value when a remainder of a value acquired by dividing, by a difference between the second period and the first period, a value acquired by multiplying a value of the first period by any natural number becomes zero. In other words, the count unit 23 sets, as a count number, a minimum value of a period in which Dt=mod (a delay time of a sub scale, a main scale period) becomes zero. Herein, Dt indicates a shift between a main scale and a sub scale.

Description is given together with a specific example according to the present example embodiment. In the present example embodiment, the first period is 8 nanoseconds, and the second period is 8.75 nanoseconds. Therefore, a count number in the present example embodiment is a minimum value at which a remainder of n×8/(8.75−8) (n is any natural number) becomes zero, and is 32. Note that n in this case is 3. Alternatively, it can also be said that the above-described count number is a period in which Dt=mod (n×0.75, 8) becomes zero. The count unit 23 generates, while incrementing 32 values such as 0 to 31 according to the count number determined in this way, and supplies the values to the sub scale signal generation unit 24.

The sub scale signal generation unit 24 receives a count signal from the count unit 23, and receives a sub scale clock signal from the clock generation unit 22. The sub scale signal generation unit 24 generates, from the received signals, a sub scale signal being relevant to the above-described count number. The sub scale signal generation unit 24 is a circuit including a shift register that generates the above-described signal.

Figure 3:
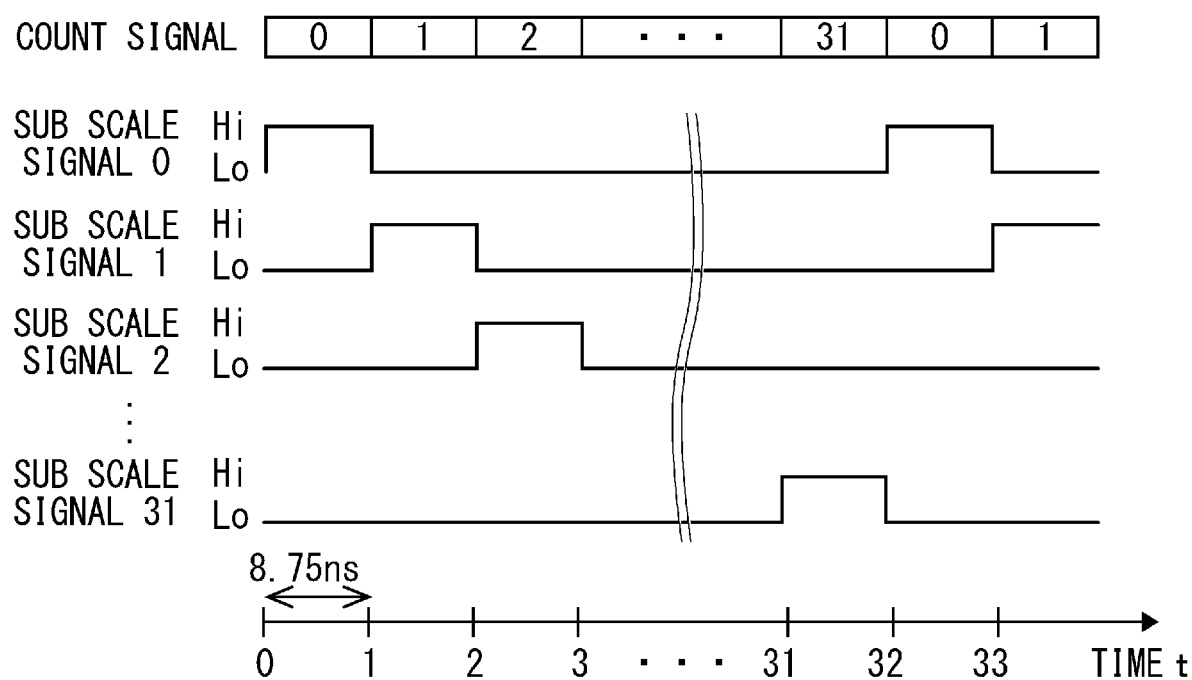
FIG. 3 is a diagram illustrating examples of a count signal and a sub scale signal according to the second example embodiment.

A function of the sub scale signal generation unit 24 is further described with reference to FIG. 3. FIG. 3 is a diagram illustrating examples of a count signal and a sub scale signal according to the second example embodiment. In the Figure, a horizontal axis indicates a time, and times plotted from t=0 in order are plotted by the second period (8.75 nanoseconds). In other words, an interval between t=0 and t=1 and an interval between t=1 and t=2 are each 8.75 nanoseconds.

Rectangular blocks arranged in a row from left to right on an uppermost stage of Figure indicate count signals. A count signal received from the count unit 23 is sequentially incremented from 0 to 31 every 8.75 nanoseconds being the second period. After a count number reaches 31 at t=31, a return is made to 0 again at t=32, and sequential increment is repeated.

A plurality of rectangular waves each illustrated under the count signal in the Figure is a sub scale signal generated by the sub scale signal generation unit 24. The sub scale signal generation unit 24 generates sub scale signals, equal in number to the count number, that each have, at a rate of once in the count number, a rectangular wave for a duration being associated with the second period while shifting a timing according to the second period. In other words, the sub scale signal generation unit 24 generates 32 sub scale signals. The sub scale signals each have a rectangular wave that becomes hi during the second period (8.75 nanoseconds) at a rate of once in 32 counts, and the rectangular waves are shifted by the second period and are configured so as not to overlap one another. The sub scale signal generation unit 24 generates a sub scale signal in this way, and supplies a plurality of generated sub scale signals to the differential signal generation unit 25. Note that sub scale signals being associated with count numbers 0 to 31 are referred to as sub scale signals 0 to 31 in the following description.

As illustrated in FIG. 2, the sub scale signal generation unit 24 includes a clock reception unit that receives a sub scale clock signal from the clock generation unit 22, a count signal reception unit that receives a count signal from the count unit 23, and a sub scale signal output unit for a count number for supplying a sub scale signal to the differential signal generation unit 25. With such a configuration, the delay time detection circuit 20 can generate a plurality of sub scale signals without including a plurality of PLL circuits.

Next, the differential signal generation unit 25 is described. The differential signal generation unit 25 receives a plurality of sub scale signals supplied from the sub scale signal generation unit 24, and receives an input clock signal having the same first period as a system clock signal being a main scale.

The input clock signal is a clock signal synchronized with a trigger signal that the delay time detection circuit 20 receives when acquiring time information. The differential signal generation unit 25 detects a differential time between the system clock signal and the input clock signal by detecting one sub scale signal having a timing coinciding with the input clock signal among a plurality of sub scale signals. Herein, a signal generated according to a signal having a timing coinciding with the input clock signal among a plurality of sub scale signals is referred to as a differential signal.

The differential signal is a signal indicating a differential time between the system clock signal and the input clock signal. The differential signal is a value set for each of a plurality of sub scale signals according to a count number of a sub scale signal, and becomes a value equal to a value acquired by multiplying a time difference between the second period and the first period by a count number. In a case according to the present example embodiment, a differential time being associated with a sub scale signal 0 is 0.75×0=0 nanoseconds. A differential time being associated with a sub scale signal 1 is 0.75×1=0.75 nanoseconds, and a differential time being associated with a sub scale signal 2 is 0.75×2=1.5 nanoseconds. Similarly, a differential time being associated with a sub scale signal 31 is 0.75×31=23.25 nanoseconds. As in a later-described specific example, the differential signal generation unit 25 activates one differential signal coinciding with an input clock signal among differential signals set as described above.

Note that differential signals being associated with the sub scale signals 0 to 31 are referred to as differential signals 0 to 31 in the following description. In other words, a sub scale signal being associated with any count number xth is a sub scale signal x, and a differential signal being associated with any count number xth is a differential signal x.

Figure 4:
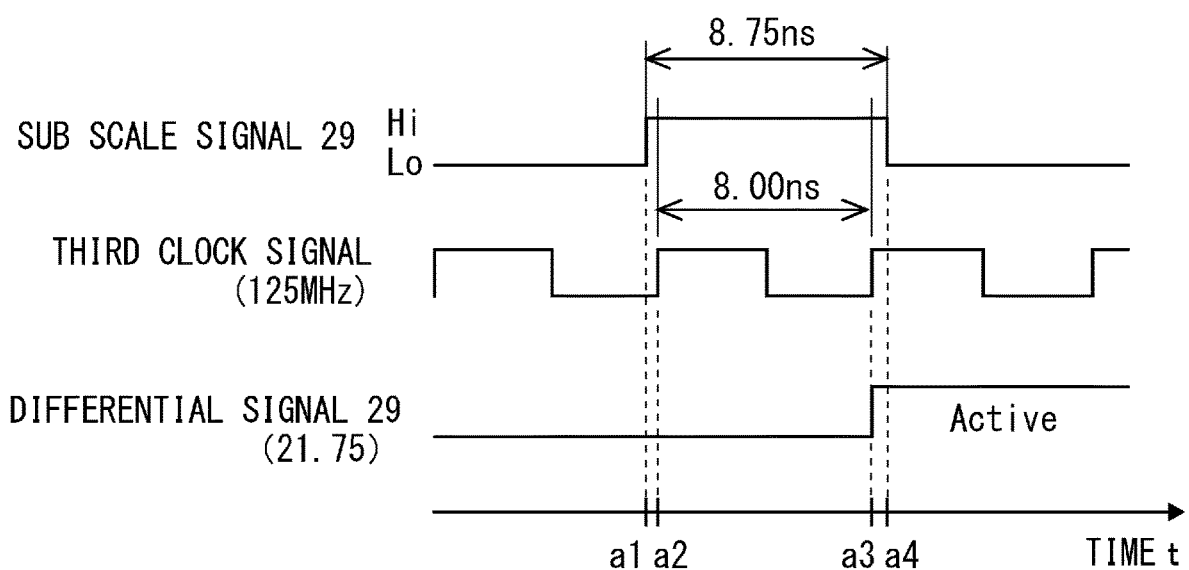
FIG. 4 is a diagram illustrating an example of each signal in a differential signal generation unit according to the second example embodiment.

Processing performed by the differential signal generation unit is further described together with a specific example illustrated in FIG. 4. FIG. 4 is a diagram illustrating an example of each signal in the differential signal generation unit according to the second example embodiment. A horizontal axis indicated in a lowermost part of the Figure is a time t. A signal indicated on the horizontal axis indicating a time is a differential signal. A signal indicated above the differential signal is an input clock signal. A signal indicated above the input clock signal is the sub scale signal 29 that is a signal being associated with a count number 29 among 32 existing sub scale signals. The input clock signal and the sub scale signal 29 illustrated in the Figure are in a state where timings thereof coincide.

A state where the timings of the input clock signal and the sub scale signal 29 coincide is specifically described. In the Figure, the sub scale signal 29 changes from lo to hi at a time t=a1. The input clock signal changes from lo to hi at a time t=a2 immediately after a time t=a1. Thereafter, the input clock signal changes from hi to lo after 4 nanoseconds, and again changes from lo to hi at a time t=a3 after elapse of a first period (8 nanoseconds) from a time t=a2. The sub scale signal 29 changes from hi to lo after elapse of a second period (8.75 nanoseconds) from a time t=a1 and at a time t=a4 immediately after a time t=a3. In other words, two rising edges of the input clock signal are included within a duration in which the sub scale signal 29 is hi. This state is referred to as a state where the timings of the input clock signal and the sub scale signal 29 coincide. When timings coincide in this way, the differential signal generation unit 25 generates a differential signal 29 being associated with the coinciding sub scale signal 29. A value of the differential signal 29 is 21.75. Therefore, the differential signal generation unit 25 supplies the value 21.75 of the differential signal 29 to the delay time calculation unit 26.

In this way, the differential signal generation unit 25 activates an associated differential signal in synchronization with the second rising edge when two rising edges of the input clock signal are included within a duration in which a sub scale signal is hi. In other words, the differential signal generation unit 25 generates one differential signal being associated with a sub scale signal whose timing coincides with the input clock signal, and supplies the generated differential signal to the delay time calculation unit 26.

Next, the delay time calculation unit 26 is described. The delay time calculation unit 26 receives one differential signal from the differential signal generation unit 25, and calculates, from the received differential signal, a delay time being associated with the differential signal.

Figure 5:
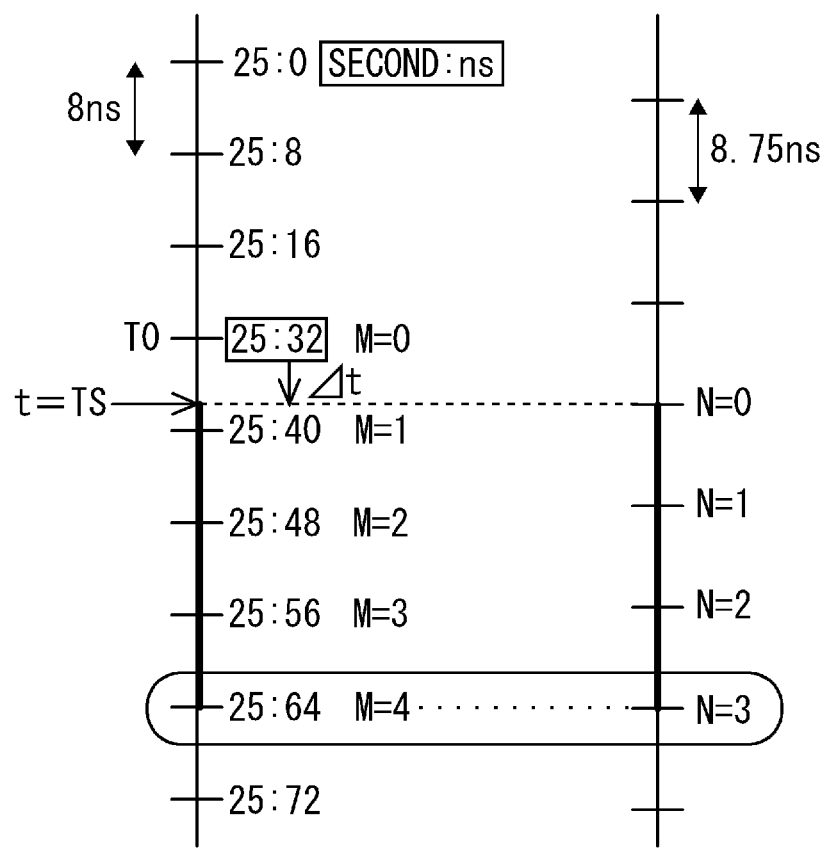
FIG. 5 is a diagram for describing a relation between a main scale and a sub scale.

A principle of processing performed by the delay time calculation unit 26 is described with reference to FIG. 5. FIG. 5 is a diagram for describing a relation between a main scale and a sub scale. Note that an example illustrated herein is illustrated in order to describe a principle of a calculation method of stamping information utilizing a main scale and a sub scale, and is not the same as the configuration according to the present example embodiment.

In the Figure, a vertical axis on a left side indicates a main scale unit 500 of a counter having a first period. Times "25:0", "25:8", and "25:16" are plotted on the vertical axis from top to bottom. Herein, "25:0" means 25 seconds and 0 nanoseconds, "25:8" means 25 seconds and 8 nanoseconds, "25:16" means 25 seconds and 16 nanoseconds, and other time displays have similar meanings. In other words, the counter of the main scale unit 500 plots a time every first period (8 nanoseconds).

Herein, it is assumed that a predetermined timestamp signal is input to the counter illustrated in the Figure at a time TS. The time TS is a time between times "25:32" and "25:40". Thus, the main scale unit 500 of the counter operating in the first period performs processing assuming that timestamp is done at the time "25:32" immediately before the time TS or at the time "25:40" immediately after the time TS. Accordingly, in order to detect a time with higher accuracy, the counter utilizes a sub scale. At being a duration from the time "25:32" immediately before the time TS to the time TS is detected by utilizing the sub scale.

In the Figure, a vertical axis on a right side indicates a sub scale unit 501 of the counter. The sub scale unit 501 starts count-up at the time TS at which a timestamp signal is input. In other words, the sub scale unit 501 of the counter plots N=0 at the time TS, and, thereafter, plots counts N=1 and N=2 every second period (8.75 nanoseconds).

Herein, timings of the main scale and the sub scale coincide at a point of a time "25:64". A count of the sub scale at the point of a time "25:64" is N=3. A count of the main scale at the point of a time "25:64" is M=4 when counted from the time "25:32" immediately before the time TS. As in Equation (1) indicated below, Δt is derived by calculating a difference between a time from counts M=0 to M=4 of the main scale and a time from counts N=0 to N=3 of the sub scale.

[Mathematical 1]

$$\Delta t = tm*M - tv*N \qquad (1)$$

Herein, tm is the first period, and M is a count number from a point where the main scale starts count-up to a point where the main scale coincides with the sub scale. tv is the second period, and N is a count number from a point where the sub scale starts count-up to a point where the sub scale coincides with the main scale. When a value in the Figure is input to Equation (1), Δt=8*4−8.75*3=32−26.25=5.75 nanoseconds.

A time of the counter at the time TS can be derived by Equation (2) indicated below.

[Mathematical 2]

$$TS = T0 \Delta t \qquad (2)$$

Therefore, in a case of an example in the Figure, TS=25:32+5.75=25:37.75, i.e., 25 seconds and 37.75 nanoseconds. In this way, a time shorter than a period of the main scale can be detected by utilizing the main scale and the sub scale.

The principle illustrated in FIG. 5 is described above. In the principle illustrated in FIG. 5, count of the sub scale is started from a point of a timestamp. On the other hand, in the present example embodiment, by detecting a sub scale signal coinciding with the input clock signal synchronized with a timestamp from among a plurality of sub scale signals, the delay time Δt of a duration shorter than a period (first period) of the main scale is calculated according to the detected sub scale signal.

In a case according to the present example embodiment, the delay time calculation unit 26 receiving a differential signal calculates a delay time Δt from the differential signal by performing a calculation indicated by Equation (3) below.

[Mathematical 3]

$$\Delta t = \mod\{Ds(c), tm\} \qquad (3)$$

Herein, Ds(c) is a value of a differential signal in a count value c.

In a case of the specific example illustrated in FIG. 4, the differential signal generation unit 25 generates the differential signal 29 being associated with the sub scale signal 29, and supplies the differential signal 29 to the delay time calculation unit 26. Thus, the delay time calculation unit 26 calculates Δt=mod(21.75, 8)=5.75 by use of Equation (3). In other words, a delay time being associated with the differential signal 29 is 5.75 nanoseconds.

The delay time calculation unit 26 outputs a delay time signal being a signal relating to a delay time calculated in this way. A delay time of an input clock signal with respect to a system clock signal can be detected with accuracy of a time shorter than the first period, by utilizing a delay time output by the delay time calculation unit 26.

Note that the delay time calculation unit 26 may have a configuration including the differential signal generation unit 25. In other words, the differential signal generation unit 25 and the delay time calculation unit 26 may be collectively referred to as the delay time calculation unit 26. In this case, the delay time calculation unit 26 includes the above-described function of the differential signal generation unit 25.

The second example embodiment is described above. However, the configuration according to the second example embodiment is not limited to the above-described content. For example, the first period of a system clock signal is naturally not limited to 8 nanoseconds. Similarly, the second period of a sub scale clock signal is not limited to 8.75 nanoseconds either. Similarly, a count number is not limited to 32 either. In the above-described example, the differential signal generation unit 25 activates an associated differential signal in synchronization with the second rising edge when two rising edges of an input clock signal are included, but the present example embodiment is not limited to this. In other words, the differential signal generation unit 25 may activate an associated differential signal in synchronization with the third rising edge when three rising edges of an input clock signal are included. In this case, the second period is longer than 1.5 times the first period and shorter than a period twice the first period. Similarly, when the differential signal generation unit 25 activates a differential signal, four or more rising edges of an input clock signal may be set. In this case, the second period is set according to the number of rising edges.

As described above, the delay time detection circuit 20 generates a plurality of sub scale signals having waveforms that do not overlap one another, from a sub scale clock signal for a sub scale generated from a system clock signal serving as a criterion. Thus, the delay time detection circuit according to the present example embodiment does not need to have a large number of PLL circuits as components. The delay time detection circuit 20 calculates a delay time by detecting one sub scale signal in which the plurality of generated sub scale signals coincide with an input clock signal. Therefore, the second example embodiment can provide a circuit and the like that generate high-accuracy time information by a simple logic circuit.

Third Example Embodiment

Figure 6:
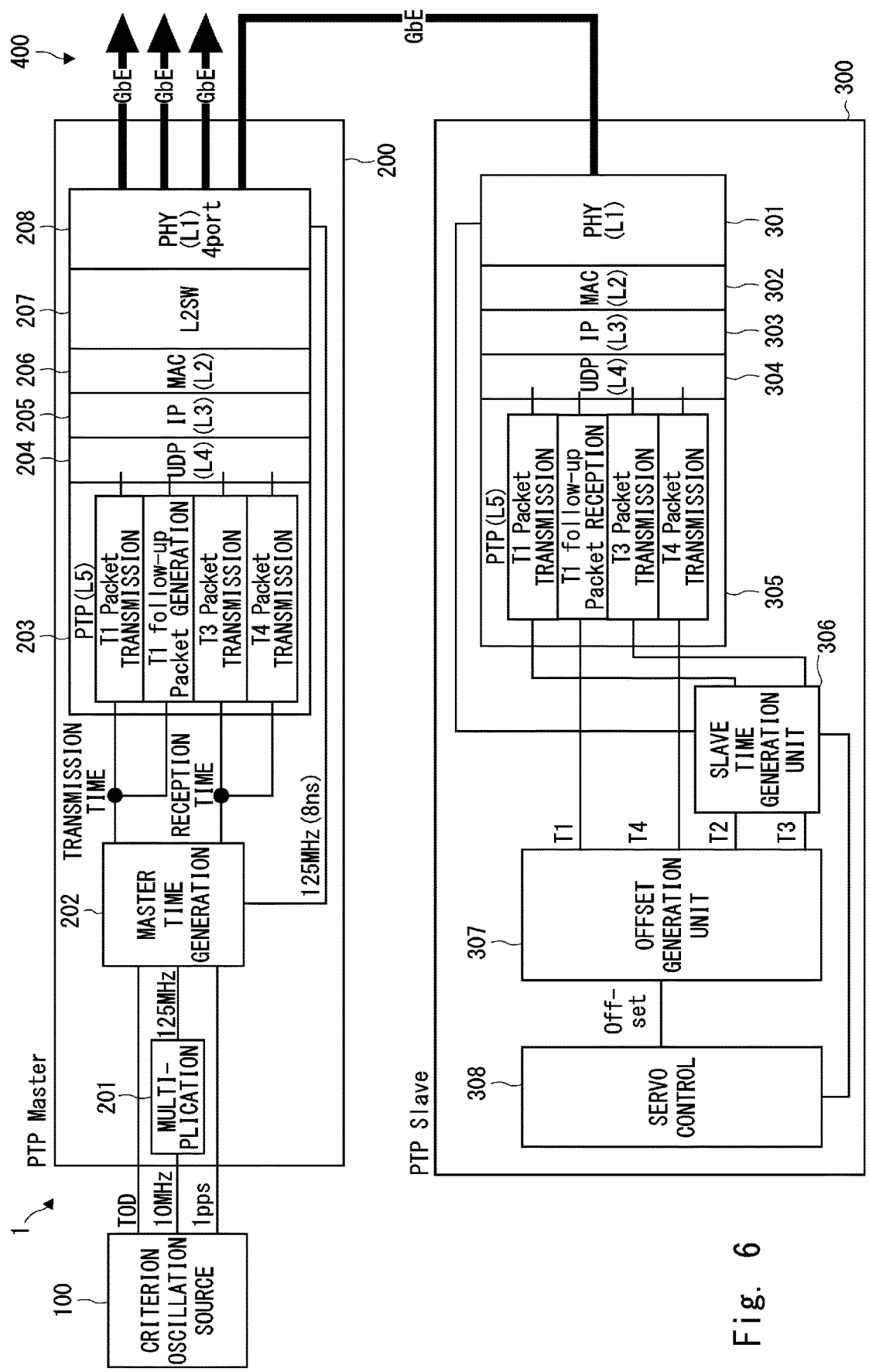
FIG. 6 is a schematic configuration diagram of a PTP system according to a third example embodiment.

Next, a third example embodiment is described. FIG. 6 is a schematic configuration diagram of a PTP system according to the third example embodiment. A PTP system 1 synchronizes a time of equipment connected by Ethernet in accordance with protocol defined in IEEE1558v2. The PTP system 1 includes, as chief components, a criterion oscillation source 100, a PTP master 200, and a PTP slave 300.

The criterion oscillation source 100 is a device that supplies, to outside, time information serving as a criterion, and is, for example, a base station of a global navigation satellite system (GNSS) or a wireless communication system. The criterion oscillation source 100 supplies the PTP master 200 with a time of day (TOD) signal, a 10-megahertz signal, and a 1 pulse per second (PPS) signal.

The PTP master 200 transmits a synchronization packet and a follow-up packet to the PTP slave 300 in accordance with protocol of PTP. The PTP master 200 receives a delay request from the PTP slave 300, and transmits a delay response being relevant to the received delay request.

The PTP master 200 receives the above-described signal from the criterion oscillation source 100, generates time information from the above-described received signal, and supplies the PTP slave 300 with a message including times T1 and T4 from generated criterion time information. The PTP master 200 includes, as chief components, a multiplication unit 201, a time generation unit 202, a PTP layer unit 203, a user datagram protocol (UDP) layer unit 204, an IP layer unit 205, an L2 layer unit 206, an L2 switch 207, and an L1 layer unit 208.

The multiplication unit 201 multiplies a 10-megahertz signal received from the criterion oscillation source 100. In a case of the present example embodiment, the multiplication unit 201 generates a 125-megahertz signal, and supplies the generated signal to the time generation unit 202.

The time generation unit 202 receives the TOD signal, the 125-megahertz signal, and the 1PPS signal, and generates time information from received signals. The time generation unit 202 supplies the PTP layer unit 203 with a synchronization packet and a follow-up packet that are generated from the generated time information. Note that the synchronization packet and the follow-up packet are signals defined in IEEE1558v2. The synchronization packet is a signal transmitted from the PTP master to the PTP slave 300, and is also referred to as a sync packet or a sync message. The follow-up packet is a signal in which the synchronization packet includes a time T1 output from the time generation unit 202, and is also referred to as a follow-up packet or a follow-up message.

The PTP layer unit 203 performs transmission of packet information including a time T1 as a session layer corresponding to a fifth layer (L5) in an open systems interconnection (OSI) reference model, generation of a follow-up packet, reception of a T3 packet including a time T3 transmitted from the PTP slave 300, and transmission of a T4 packet including a time T4.

The UDP layer unit 204 performs transmission control for delivering a signal to a transmission destination, in accordance with protocol of a transport layer corresponding to a fourth layer (L4) in the OSI reference model. The IP layer unit 205 performs selection of a communication path in a network, in accordance with protocol of a network layer corresponding to a third layer (L3) in the OSI reference model. The L2 layer unit 206 performs establishment of a physical communication path, in accordance with protocol of a data link layer corresponding to a second layer (L2) in the OSI reference model. The L2 switch 207 determines a relay destination according to information about a partner included in a packet, and performs relay of communication for the determined relay destination.

The L1 layer unit 208 performs conversion and the like of an electric signal, in accordance with protocol of a physical layer corresponding to a first layer (L1) in the OSI reference model. In an example illustrated in the Figure, a connection destination dealt with by the L1 layer unit 208 is a network 400 called four-channel gigabit Ethernet (GbE). The PTP master 200 is connected to the PTP slave 300 via one channel in the network 400 having four channels.

The PTP slave 300 is a device having a function of receiving time information from the PTP master 200, and synchronizing a time with the PTP master 200 in accordance with protocol of PTP. The PTP slave 300 receives a synchronization packet and a follow-up packet from the PTP master 200 in accordance with protocol of PTP. The PTP slave 300 transmits a delay request to the PTP master 200, and receives a delay response being relevant to the transmitted delay request from the PTP master 200.

The PTP slave 300 is configured in such a way as to operate in accordance with communication protocol similar to that of the PTP master 200. In other words, an L1 layer unit 301 operates in accordance with the protocol of the first layer in the OSI reference model, an L2 layer unit 302 operates in accordance with the protocol of the second layer, an IP layer unit 303 operates in accordance with the protocol of the third layer, a UDP layer unit 304 operates in accordance with the protocol of the fourth layer, and a PTP layer unit 305 operates in accordance with the protocol of the fifth layer. Thus, description herein is omitted.

The PTP slave 300 further includes a slave time generation unit 306, an offset time generation unit 307, and a servo control unit 308. The slave time generation unit 306, the offset time generation unit 307, and the servo control unit 308 generate a master time in cooperation with one another. A function relating to generation of the master time is a content recommended by IEEE1558v2. Thus, detailed description herein is omitted. A configuration of the servo control unit 308 is left to a user on the recommendation of IEEE1558v2. In the present example embodiment, the servo control unit 308 has a function of suppressing an event referred to as a time jump by performing feedback control when there is a time jump due to a PTP master or other network load variations.

Note that, as described above, the present example embodiment exemplifies a two-step method that transmits a synchronization packet and a follow-up packet to the PTP slave 300 from the PTP master 200. However, naturally, the PTP master 200 may adopt a one-step method that does not transmit a follow-up packet. Note that, in the above-described PTP system 1, the PTP master 200 and the PTP slave 300 are also referred to as a stamping information generation device.

Next, a TC function that the PTP system 1 has is described with reference to FIGS. 7, 8A, and 8B. The TC function is a function for correcting directionality of a transmission time in the PTP system. Herein, directionality of a transmission time means that a transmission time of communication from one side to another differs from a transmission time of communication in an opposite direction. In the PTP system, when such directionality of a transmission time exists, this becomes an error of time synchronization. Thus, IEEE1558v2 recommends the TC function for correcting this. Note that the TC function itself is a well-known technique. Thus, in the present disclosure, a content that can be understood by a person skilled in the art is omitted appropriately, regarding details of the TC function.

Figure 7:
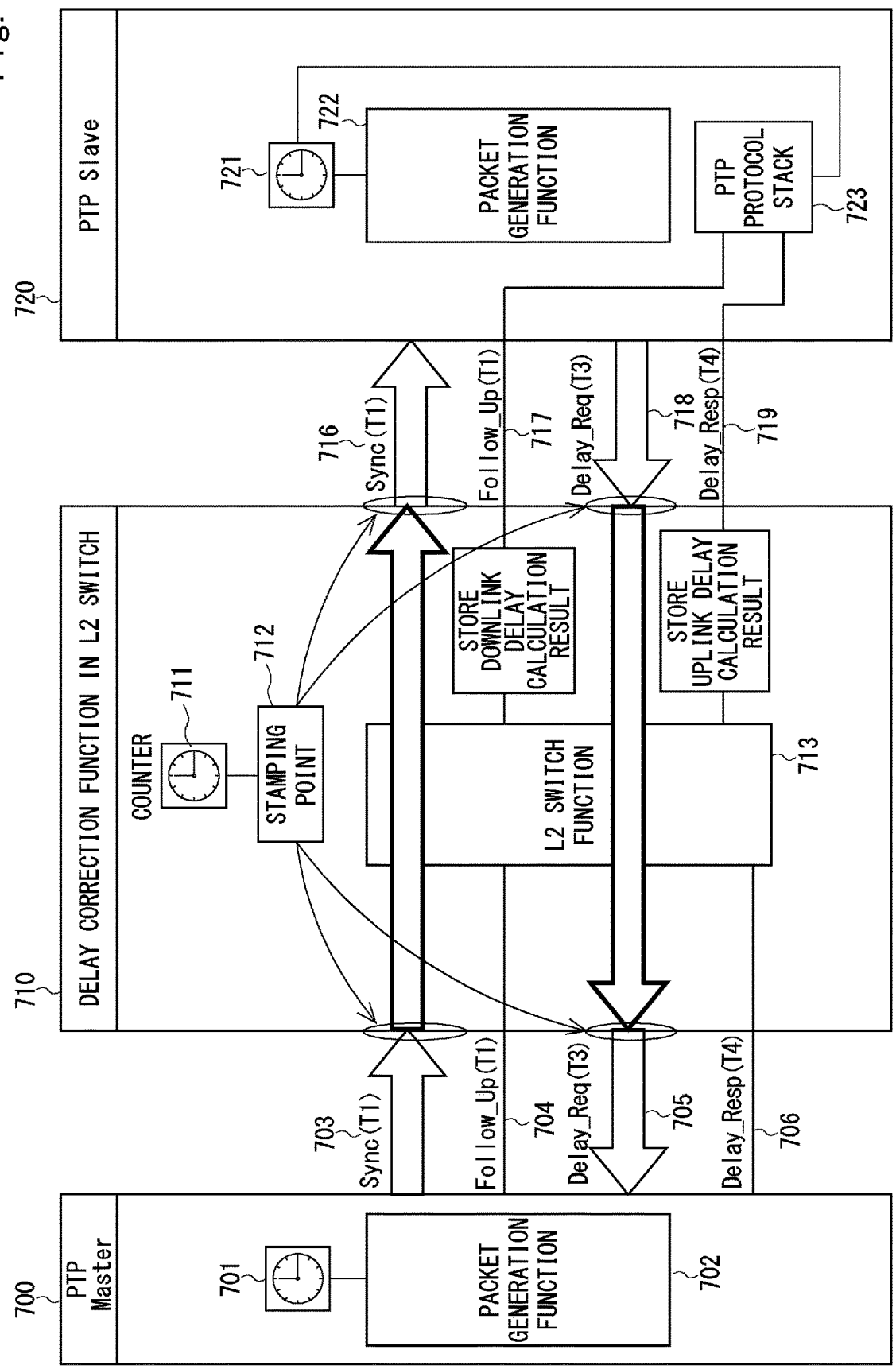
FIG. 7 is a diagram illustrating a flow of a signal of the PTP system according to the third example embodiment.

FIG. 7 is a diagram illustrating a flow of a signal of the PTP system according to the third example embodiment. For convenience of description, FIG. 7 illustrates components of the PTP system as a PTP master 700, an L2 switch 710, and a PTP slave 720. The Figure schematically illustrates the chief components and exchange of a signal.

First, processing in which the PTP slave 720 acquires a delay time in a direction from the PTP master 700 toward the PTP slave 720 (hereinafter, also referred to as a downlink direction) is described. The PTP master 700 generates a master time in a master time generation unit 701, and supplies a synchronization packet 703 to the L2 switch 710 via a packet generation function 702. When receiving the synchronization packet 703, the L2 switch 710 performs predetermined processing on the synchronization packet 703 in an L2 switch function 713. The L2 switch 710 supplies a synchronization packet 716 to the PTP slave 720. In this instance, the L2 switch 710 records a time at which the synchronization packet 703 is received, by utilizing a counter 711. Similarly, the L2 switch 710 stores, in a stamping point storage area 712, a time at which the synchronization packet 716 is transmitted, by utilizing the counter 711.

The L2 switch 710 calculates a downlink delay by calculating, from the time of storing in the stamping point storage area 712, a difference between the time at which the synchronization packet 703 is received and the time at which the synchronization packet 716 is transmitted. After receiving a follow-up packet 704 from the PTP master 700, the L2 switch 710 supplies the received signal and information about the calculated downlink delay to the PTP slave 720 as a follow-up packet 717.

Next, processing in which the PTP slave 720 acquires a delay time in a direction from the PTP slave 720 toward the PTP master 700 (hereinafter, also referred to as an uplink direction) is described. The PTP slave 720 generates a slave time in a slave time generation unit 721, and supplies a delay request 718 to the L2 switch 710 via a packet generation function 722. When receiving the delay request 718, the L2 switch 710 performs predetermined processing on the delay request 718 in the L2 switch function 713. The L2 switch 710 supplies a delay request 705 to the PTP master 700. In this instance, the L2 switch 710 records a time at which the delay request 718 is received, by utilizing the counter 711. Similarly, the L2 switch 710 stores, in the stamping point storage area 712, a time at which the delay request 705 is transmitted, by utilizing the counter 711.

The L2 switch 710 calculates an uplink delay by calculating, from the time of storing in the stamping point storage area 712, a difference between the time at which the delay request 718 is received and the time at which the delay request 705 is transmitted. After receiving a delay response 706 from the PTP master 700, the L2 switch 710 supplies the received signal and information about the calculated uplink delay to the PTP slave 720 as a delay response 719.

In this way, the L2 switch 710 stores the time at which the synchronization packet 703 is received and the time at which the synchronization packet 716 is transmitted, and stores information about the stored times in the follow-up packet 717. Moreover, the L2 switch 710 stores the time at which the delay request 718 is received and the time at which the delay request 705 is transmitted, and stores information about the stored times in the delay response 719.

The PTP slave 720 acquires information about a downlink delay and information about an uplink delay by the above-described processing. The PTP slave 720 generates a time reflecting the information about the downlink delay and the information about the uplink delay acquired in this way, and corrects a slave time by use of the generated time.

Figure 8A:
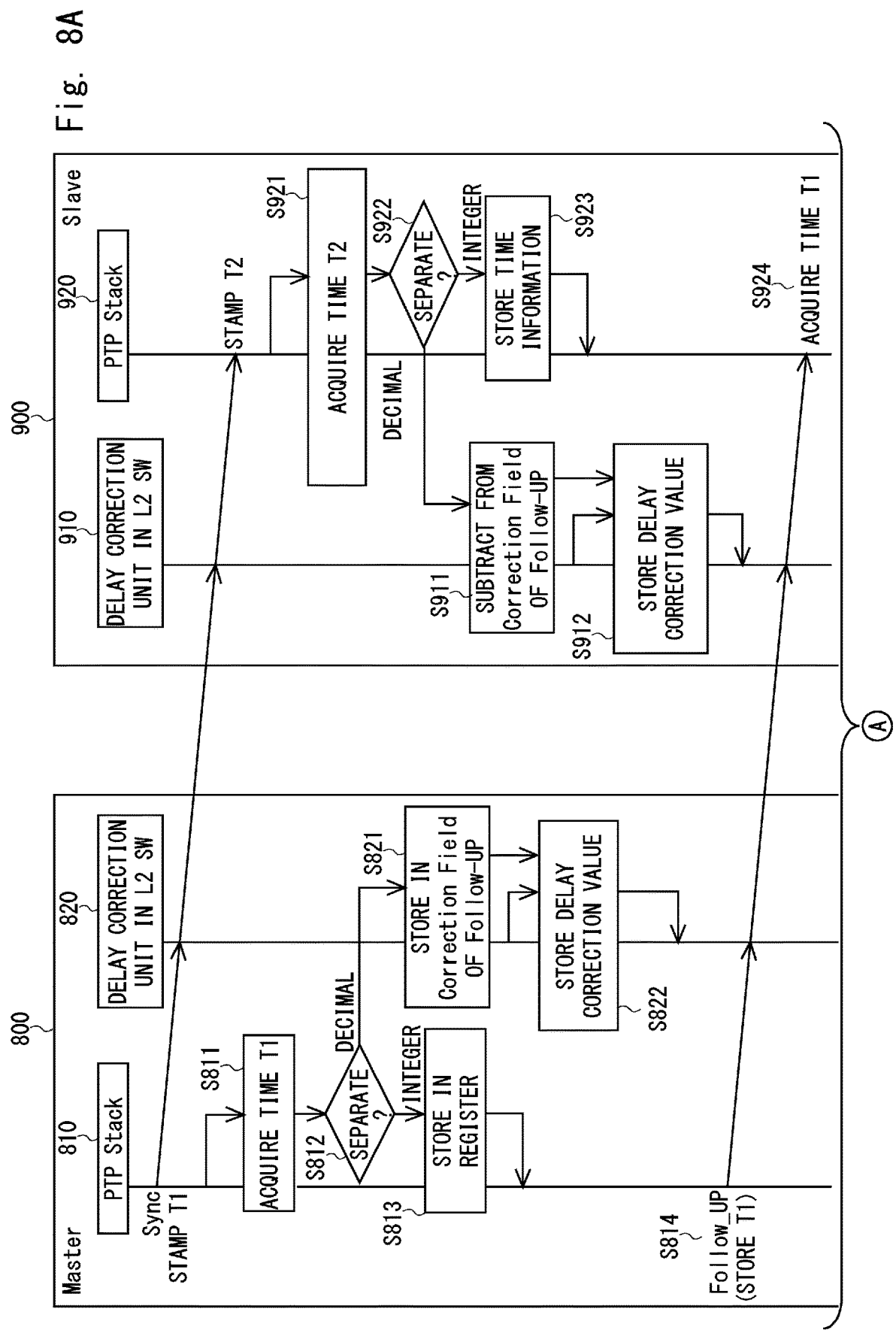
FIG. 8A is a sequence diagram illustrating an operation of the PTP system according to the third example embodiment.
Figure 8B:
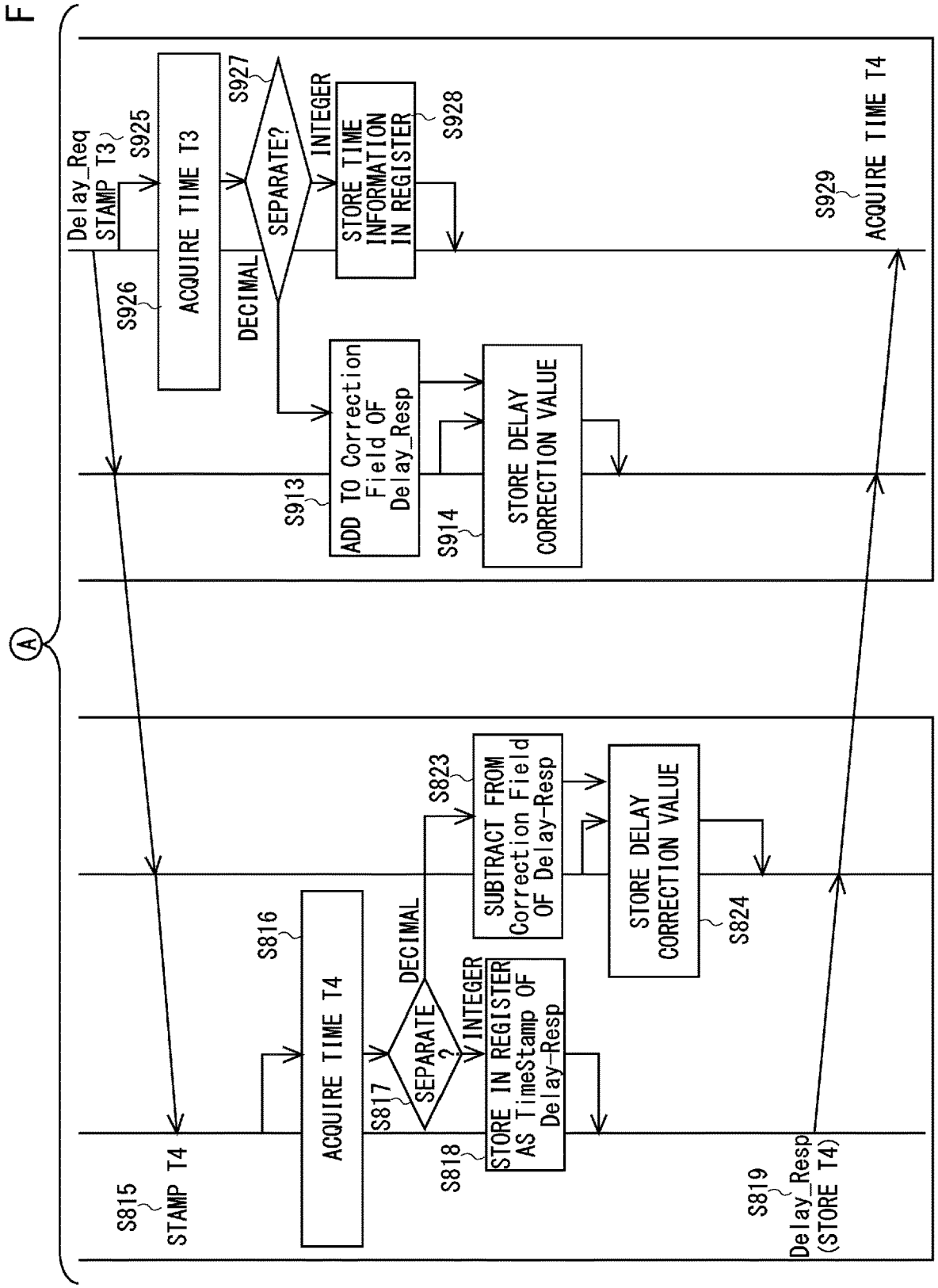
FIG. 8B is a sequence diagram illustrating an operation of the PTP system according to the third example embodiment.

FIGS. 8A and 8B are sequence diagrams illustrating details of the TC function described in FIG. 7. In the Figure, a PTP master 800 is communicably connected to a PTP slave 900 by Ethernet. The PTP master 800 includes a PTP stack 810, and a delay correction unit 820 in an L2 switch. The PTP slave 900 includes an in-L2-switch delay correction unit 910 and a PTP stack 920. Note that one L2 switch is interposed between the PTP master 700 and a PTP slave 730 in the configuration in FIG. 7. However, in an actual example, the PTP master 800 and the PTP slave 900 each have an L2 switch, as illustrated in FIGS. 8A and 8B.

Hereinafter, a case of processing a synchronization packet and a follow-up packet is described with reference to FIG. 8A. First, processing on the PTP master 800 side is described. The PTP master 800 transmits a synchronization packet to the PTP slave 900. In this instance, a signal generated in the PTP stack 810 is output to the PTP slave 900 via the delay correction unit 820. As illustrated in FIG. 7, the delay correction unit 820 on the PTP master 800 side stores information about a delay occurring in the delay correction unit 820.

Next, the PTP master 800 generates a follow-up packet. The PTP stack 810 acquires a time T1 being stamping information (step S811). Next, when a value included in the time T1 includes an integral part and a decimal part, the PTP stack 810 separates the value into the integral part and the decimal part (step S812), and stores the integral part in a register as time information included in the follow-up packet (step S813). The PTP stack 810 supplies the separated decimal part to the delay correction unit 820 (step S814).

The delay correction unit 820 stores, in a collection field of the follow-up packet, the decimal part received from the PTP stack 810 (step S821). Next, the delay correction unit 820 corrects a value of the decimal part stored in the collection field, by use of information about a delay stored when the synchronization packet is transmitted (step S822).

Next, the PTP master 800 transmits the above-described integral part and the corrected decimal part to the PTP slave 900 as a follow-up packet (step S814).

Next, processing on the PTP slave 900 side is described. The PTP slave 900 receives a synchronization packet transmitted from the PTP master 800. In this instance, the delay correction unit 910 relays the received synchronization packet, and transmits the synchronization packet to the PTP stack 920. The delay correction unit 910 stores information about a delay occurring in the delay correction unit 910 herein.

The PTP stack 920 receives the synchronization packet received from the delay correction unit 910, stamps a time T2 at which the synchronization packet is received, and acquires a stamping time (step S921).

Next, the PTP stack 920 separates a value included in the time T2 into an integral part and a decimal part (step S922), and stores the integral part in a register as time information included in the follow-up packet (step S923). The PTP stack 920 supplies the separated decimal part to the delay correction unit 910 (step S922).

Next, the delay correction unit 910 stores, in a collection field of the follow-up packet, the decimal part received from the PTP stack 920 (step S911). Next, the delay correction unit 910 corrects a value of the decimal part stored in the collection field by use of information about a delay stored when the synchronization packet is received (step S912).

Next, the PTP slave 900 receives a follow-up packet from the PTP master 800 (step S924). In this instance, the follow-up packet and the above-described corrected decimal part are stored in the PTP stack 920.

Next, processing when signals of a delay request and a delay response are each transmitted and received is described with reference to FIG. 8B. However, description is omitted appropriately regarding processing similar to the processing performed when a synchronization packet and a follow-up packet are transmitted and received.

First, the PTP stack 920 included in the PTP slave 900 generates a delay request (step S925). Herein, the PTP stack 920 stamps and acquires a time T3 at which the delay request is transmitted (step S926). The PTP stack 920 supplies the generated delay request to the delay correction unit 910. The delay correction unit 910 relays the received delay request, and transmits the delay request to the PTP master 800. In this instance, the delay correction unit 910 stores information about a delay occurring due to processing in the L2 switch.

Next, the PTP stack 920 separates the acquired information about the time T3 into an integral part and a decimal part (step S927), and stores the integral part in a register (step S928). The delay correction unit 910 stores, in a collection field, the decimal part received from the PTP stack 920, and performs a correction of the decimal part by use of the stored information about the delay (step S914).

Next, processing of the PTP master 800 is described. When receiving a delay request, the PTP master 800 stores information about a delay in the delay correction unit 820. The PTP stack 810 stamps a time T4 at which the delay request is received (step S815). Thereafter, the PTP stack 810 separates the information about the time T4 generated by the PTP stack 810 into an integral part and a decimal part, by performing processing similar to the processing described with reference to FIG. 8A (step S817). The PTP master 800 transmits, as a delay response to the PTP slave 900, the integral part of the time T4 stored in the register by the PTP stack 810, and information about a delay and correction information of the decimal part that are generated by the delay correction unit 820 (step S819).

Next, the PTP slave 900 receives a delay response from the PTP master 800 (step S929). In this instance, the delay response and the above-described corrected decimal part are stored in the PTP stack 920.

As a result of the above-described processing, the PTP slave 900 acquires the times T1 to T4, and delay information by the TC function. Therefore, the PTP slave 900 corrects an error due to a difference of delay times, and performs synchronization of time information with the PTP master 800.

Figure 9:
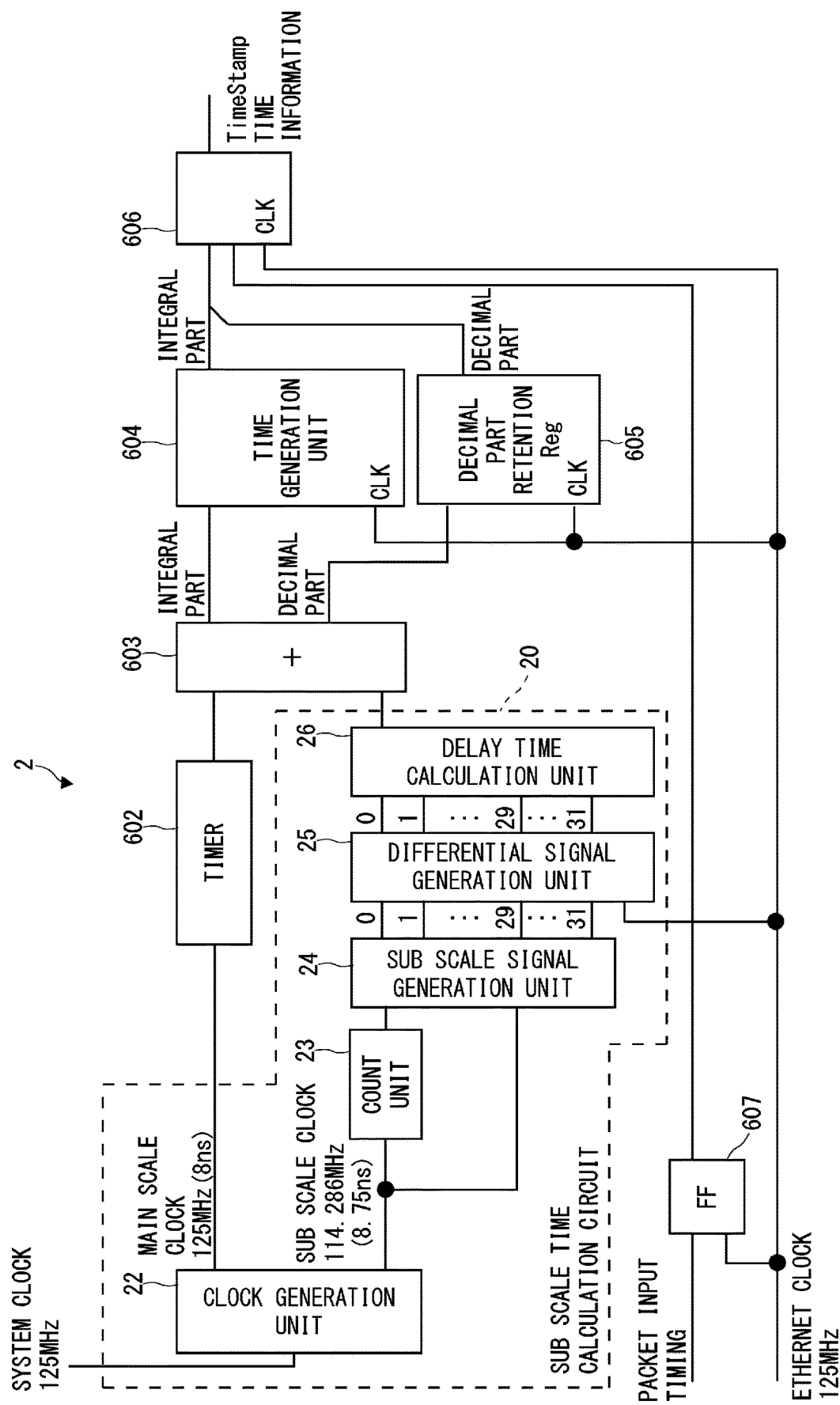
FIG. 9 is a schematic configuration diagram of a stamping information generation device according to the third example embodiment.

Next, a stamping information generation function of the PTP master and the PTP slave is described with reference to FIG. 9. FIG. 9 is a schematic configuration diagram of the stamping information generation device according to the third example embodiment. Herein, the stamping information generation device refers to one or both of the PTP master and the PTP slave. A circuit illustrated in the Figure is a schematic configuration diagram of a circuit included in a stamping information generation device 2.

The stamping information generation device 2 generates stamping information with, as a trigger, an input timing of a packet signal (a packet input timing signal) received from outside. The stamping information is information including a time at which a trigger signal is received. The stamping information generation device 2 includes, as chief components, a delay time detection circuit 20, a timer 602, an adder 603, a time generation unit 604, a decimal part retention register 605, a stamping information output unit 606, and a flip-flop 607.

The delay time detection circuit 20 has a configuration described in the second example embodiment. Thus, detailed description herein is omitted, and an overview is described below. The delay time detection circuit 20 generates a delay time by receiving an Ethernet clock. The Ethernet clock is a clock signal synchronized with a packet input timing signal. Therefore, a delay time generated by the delay time detection circuit 20 corresponds to a delay time when the packet input timing signal is received.

A clock generation unit 22 included in the delay time detection circuit 20 is connected to a system clock, and generates, from a frequency of 125 megahertz of the system clock, a system clock signal of a first period (8 nanoseconds) as a main scale clock, and a sub scale clock signal of a second period (8.75 nanoseconds) as a sub scale clock. The delay time detection circuit 20 is configured in such a way as to generate a plurality of sub scale signals by utilizing the sub scale clock signal, and detect a sub scale signal coinciding with the Ethernet clock. The delay time detection circuit 20 calculates a delay time between the sub scale clock and the Ethernet clock, and supplies information about the calculated delay time to the adder 603.

The timer 602 generates timer information by use of a system clock signal received from the clock generation unit 22. The timer 602 is a timer information generation device that starts count-up according to the first period along with startup of the timer 602. The timer 602 supplies the generated timer information to the adder 603.

The adder 603 receives the information about the delay time from the delay time detection circuit 20, and receives the timer information from the timer 602. The adder 603 adds pieces of the received information. Note that the information about the delay time includes an integral part and a decimal part. The timer information includes only an integral part to which 8 nanoseconds are added every first period. Note that an "integral part" means a value on a one-nanosecond unit in the description of FIG. 9. A "decimal part" means a value smaller than one nanosecond. For example, when information about a delay time is "5.75" nanoseconds, an integral part of the delay time is "5", and a decimal part of the delay time is "0.75". For example, when information about a count number is "8" nanoseconds, the adder 603 calculates 5.75+8=13.75, and separates the calculated value into an integral part "13" and a decimal part "0.75". As described above, the adder 603 adds the information about the delay time and the information about the count number, and then separates an integral part and a decimal part from the added value. The adder 603 supplies the integral part to the time generation unit 604, and supplies the decimal part to the decimal part retention register 605.

The time generation unit 604 has a function of generating a PTP epoch time from a predetermined count number. The time generation unit 604 receives the integral part from the adder 603, and receives a clock signal (125 megahertz) of the Ethernet clock. The time generation unit 604 is connected to the stamping information output unit 606, and supplies generated time information to the stamping information output unit 606. In other words, the time generation unit 604 generates time information being a PTP epoch time from the integral part received from the adder 603, and supplies the generated time information to the stamping information output unit 606 according to a timing of the Ethernet clock.

The decimal part retention register 605 has a function of retaining a value of a decimal part received from the adder 603. When a value of a new decimal part is supplied from the adder 603, the decimal part retention register 605 erases an old value. Alternatively, when a value of a new decimal part is supplied from the adder 603, the decimal part retention register 605 overwrites an old value. The decimal part retention register 605 receives the clock signal (125 megahertz) of the Ethernet clock. Therefore, the decimal part retention register 605 supplies a value of a retained decimal part to the stamping information output unit 606 according to a timing of the Ethernet clock.

The stamping information output unit 606 receives time information from the time generation unit 604, and receives a value of a decimal part from the decimal part retention register 605. The stamping information output unit 606 adds the time information and the value of the decimal part, and generates stamping information. The stamping information output unit 606 is connected to the flip-flop 607, and receives a packet input timing signal via the flip-flop 607. In the stamping information output unit 606, the packet input timing signal serves as a latch signal. Therefore, the stamping information output unit 606 retains the generated stamping information with the received packet input timing signal as a trigger.

The packet input timing signal is a signal to be a trigger instructing to stamp time information. For example, when the stamping information generation device 2 illustrated in the Figure is a PTP slave, a synchronization packet received by the PTP slave corresponds to the packet input timing signal. In this case, the stamping information generation device 2 outputs a time T2 in the PTP system.

The stamping information output unit 606 receives a clock signal of the Ethernet clock. Note that the flip-flop 607 operates by receiving the clock signal of the Ethernet clock. Thus, the packet input timing signal is supplied to the stamping information generation device 2 with the same timing as the Ethernet clock.

With such a configuration, the stamping information output unit 606 retains generated stamping information with a timing at which the packet input timing signal is received, and outputs the retained stamping information to outside. The stamping information includes a delay time detected by a sub scale. Thus, the stamping information generation device 2 can generate stamping information with finer accuracy than the first period (8 nanoseconds) being a main scale.

The PTP master and the PTP slave each have the above-described stamping information generation function, and, thereby, stamping information of a time finer than a period of a system clock or an Ethernet clock being a main scale can be generated. In other words, the stamping information generation device can provide a device that generates high-accuracy time information by a simple logic circuit, by detecting a delay time by a sub scale. The PTP system adopts the TC function, has the stamping information generation function, and, thereby, can provide high-accuracy time information.

The third example embodiment is described above. The third example embodiment can provide a stamping information generation device and the like that synchronize a time by use of high-accuracy time information by a simple logic circuit.

Fourth Example Embodiment

Figure 10:
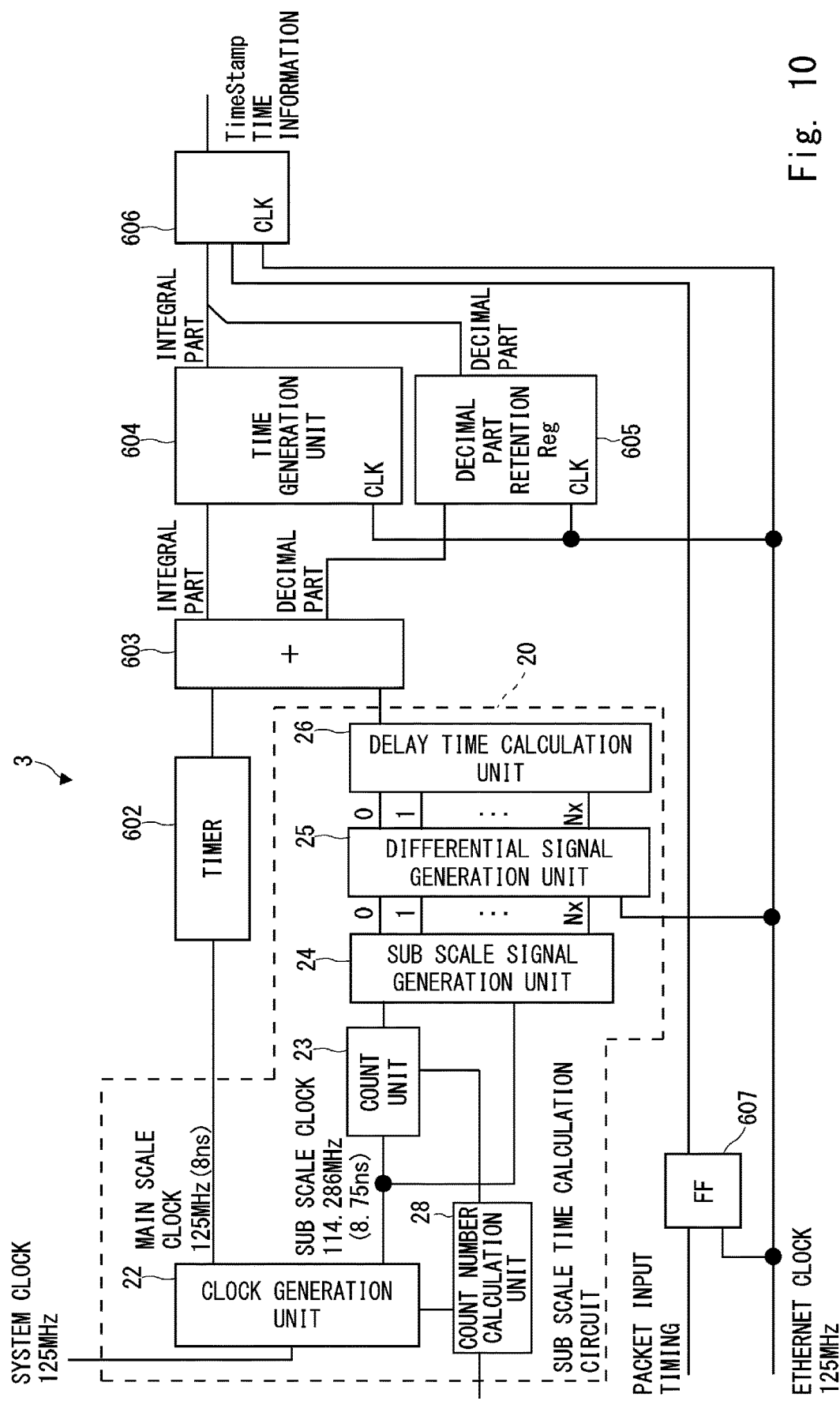
FIG. 10 is a schematic configuration diagram of a stamping information generation device according to a fourth example embodiment.

Next, a fourth example embodiment is described with reference to FIG. 10. A stamping information generation device according to the fourth example embodiment differs from that according to the third example embodiment in that a period of a sub scale clock signal can be set. FIG. 10 is a schematic configuration diagram of the stamping information generation device according to the fourth example embodiment. A difference between a stamping information generation device 3 according to the fourth example embodiment and that according to the third example embodiment is described below.

A delay time detection circuit 20 included in the stamping information generation device 3 includes a count number calculation unit 28. The count number calculation unit 28 receives a setting value from outside, and determines a count number according to the received setting value. Herein, the setting value corresponds to a value of a second period. The setting value is settable to any value within a range being larger than a first period and smaller than a value twice the first period. The count number calculation unit 28 calculates a count number by performing a later-described calculation by use of the received setting value, and supplies the calculated count number to a count unit 23. The count number calculation unit 28 is connected to a clock generation unit 22, and instructs the clock generation unit 22 to oscillate a clock signal with the setting value as a second period.

Figure 11:
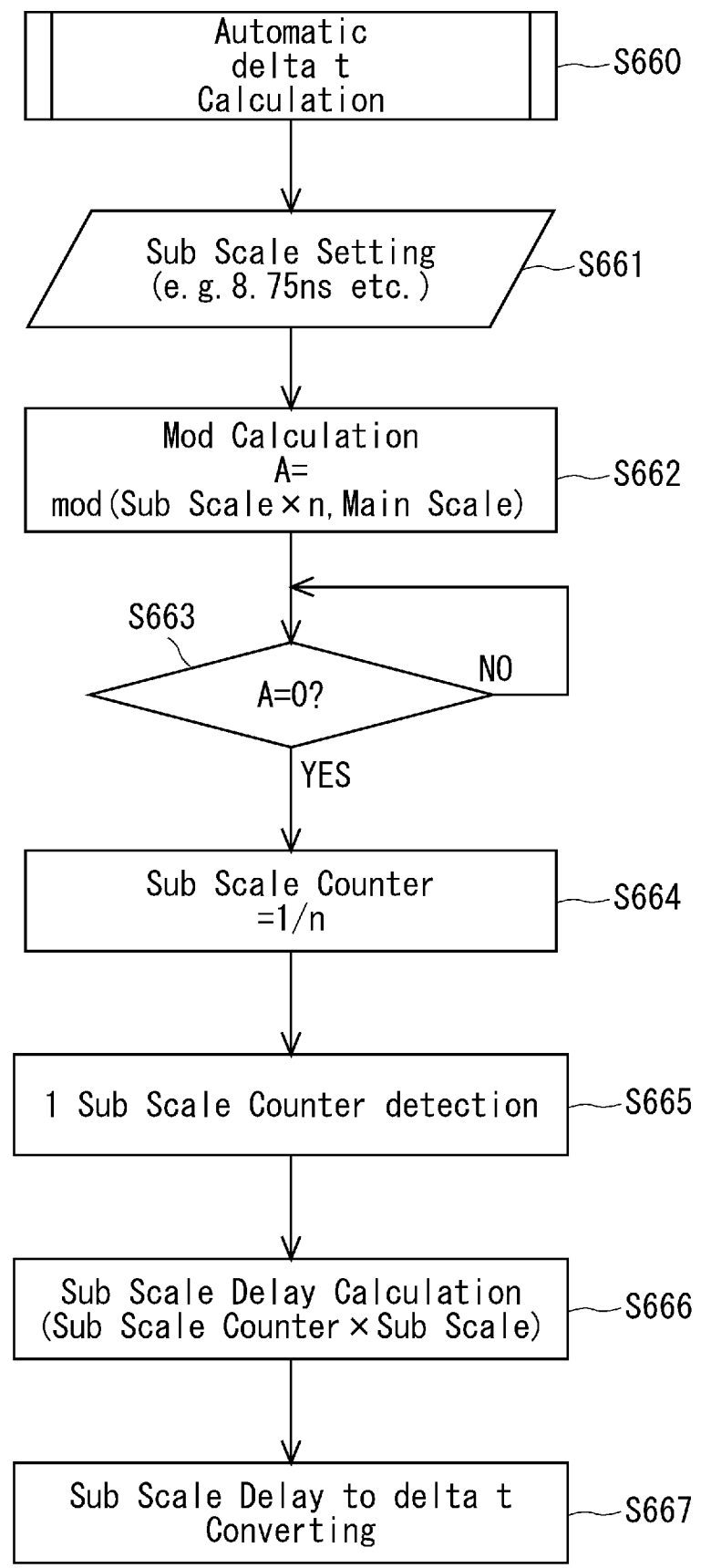
FIG. 11 is a flowchart of count number setting processing in the stamping information generation device according to the fourth example embodiment.

Next, processing of the delay time detection circuit including the count number calculation unit 28 is described with reference to FIG. 11. The count number calculation unit 28 has a function of automatically calculating a count number from a period of a sub scale clock signal that is utilized for a sub scale. FIG. 11 is a flowchart of count number setting processing in the delay time detection circuit according to the fourth example embodiment.

First, the delay time detection circuit 20 starts an automatic $\Delta t$ calculation routine (step S660). Next, the count number calculation unit 28 receives, from outside, a setting value to be a period of a sub scale (step S661). A period of a sub scale may be set by a user, or may be set by another device or system.

Next, the count number calculation unit 28 executes an equation that calculates a remainder of subtracting, from the setting value, a value of a first period being a main scale, as indicated by Equation (4) below (step S662).

[Mathematical 4]

$$A = \mathrm{mod}\{\text{Sub Scale} \times n, \text{Main Scale}\} \quad (4)$$

Herein, A indicates a remainder. "Sub Scale" indicates a setting value (e.g., 8.75), and n indicates a counter number. "Main Scale" indicates a period (e.g., 8) of a sub scale.

Next, the count number calculation unit 28 detects a count number n with which a remainder A becomes zero (step S663). For example, the count number calculation unit 28 performs a calculation of Equation (4) while incrementing a value by one from n=1, and repeats increment of n until a count number n with which the remainder A becomes zero emerges. For example, when a period of a sub scale is 8.75 nanoseconds, a count number with which the remainder A becomes 0 is 32. In other words, when a count number is 32, Equation (4) becomes 8.75×32/8=280, and if this is divided by 8, 280/8=35, and a remainder is 0. According to a similar calculation, for example, when a period of a sub scale is 8.5 nanoseconds, a count number becomes 16.

In this way, when not determining that A=0 (step S663: No), the count number calculation unit 28 increments n of Equation (4), again performs a calculation, and determines whether a value of the remainder A is 0. When determining that A=0 (step S663: Yes), the count number calculation unit 28 sets a count number of a sub scale to a value when A=0 (step S664).

The delay time detection circuit 20 generates a plurality of sub scale signals by utilizing the count number set by the count number calculation unit 28. Further, the delay time detection circuit 20 detects a sub scale signal whose timing coincides with a reference signal having a first period among the generated plurality of sub scale signals. Specifically, the delay time detection circuit 20 processes, as a timing coinciding with the input clock signal, a case where two rising edges of the input clock signal are included within a duration of a second period that the sub scale signal has (step S665).

Next, the delay time detection circuit 20 generates a differential signal from the sub scale signal whose timing coincides with the input clock signal. Specifically, a differential signal generation unit 25 included in the delay time detection circuit 20 generates a differential signal by multiplying a count number being associated with the sub scale signal whose timing coincides with the input clock signal, and a difference between the second period and the first period (step S666).

Next, the delay time detection circuit 20 calculates a delay time $\Delta t$ from the differential signal (step S667). Specifically, the delay time detection circuit 20 calculates the delay time $\Delta t$ by use of Equation (3) above.

The function that the delay time detection circuit 20 has is described above. The delay time detection circuit 20 can set a sub scale of any period in a preset range by having the above-described function.

The fourth example embodiment is described above. The fourth example embodiment can provide a stamping information generation device and the like that synchronize a time by use of high-accuracy time information by a simple logic circuit, and provide a stamping information generation device and the like being capable of setting a period of a sub scale.

The present disclosure is not limited to the above-described example embodiments, and can be suitably changed without departing from the spirit. For example, a timing coinciding with an input clock signal described in the second and third example embodiments may be set to a case where two falling edges of the input clock signal are included within a duration of a second period that a sub scale signal has. The count number calculation unit illustrated in the fourth example embodiment may have a configuration that is included in the stamping information generation device and not included in the delay time detection circuit.

While the invention of the present application has been described above with reference to the example embodiments, the invention of the present application is not limited by the above description. Various changes that may be understood by a person skilled in the art can be made to a configuration and details of the invention of the present application within the scope of the invention.

This application is based upon and claims the benefit of priority from Japanese Patent Application No. 2018-212047, filed on Nov. 12, 2018, the disclosure of which is incorporated herein in its entirety by reference.

REFERENCE SIGNS LIST

1 PTP system
2, 3 Stamping information generation device
10, 20 Delay time detection circuit
11, 22 Clock generation unit
12, 23 Count unit
13, 24 Sub scale signal generation unit
14, 26 Delay time calculation unit
21 System clock oscillator
25 Differential signal generation unit
28 Count number calculation unit
100 Criterion oscillation source
200 PTP master
202 Time generation unit
203, 305 PTP layer unit
204, 304 UDP layer unit
205, 303 IP layer unit
206, 302 L2 layer unit
207 L2 switch
208, 301 L1 layer unit
300 PTP slave
306 Slave time generation unit
308 Servo control unit
400 Network
602 Timer
603 Adder
604 Time generation unit
605 Decimal part retention register
606 Stamping information output unit
607 Flip-flop
700 PTP master
701 Master time generation unit
702 Packet generation function
710 L2 switch
711 Counter
720 PTP slave
721 Slave time generation unit
730 PTP slave
800 PTP master
810, 920 PTP stack
820, 910 Delay correction unit
900 PTP slave

What is claimed is:

1. A delay time detection circuit that detects a delay time of an input clock signal having a first period with respect to a system clock signal by use of the system clock signal corresponding to a main scale and having the first period, and a sub scale clock signal corresponding to a sub scale and having a second period differing from the first period, the delay time detection circuit comprising:
a clock generation unit configured to generate a sub scale clock signal, based on the system clock signal;
a count unit configured to generate a count signal while sequentially and repeatedly incrementing a preset count number, based on the sub scale clock signal;
a sub scale signal generation unit configured to receive the count signal, and to generate sub scale signals, equal in number to the count number, that each have, at a rate of once in the count number, a rectangular wave for a duration being associated with the second period and that are shifted in timing relative to one another according to the second period;
a delay time calculation unit configured to receive the input clock signal, and to calculate a delay time within a range of the first period of the input clock signal with respect to the system clock signal, based on one of the sub scale signals having a timing coinciding with the input clock signal among a plurality of the sub scale signals;
a count number calculation unit configured to receive a value of the second period as a setting value, and to determine the count number, based on the received setting value and the first period,
wherein the delay time calculation unit processes, as a timing coinciding with the input clock signal, either
a case where two or more rising edges of the input clock signal are included within a duration being associated with the second period of the rectangular wave, or
a case where two or more falling edges of the input clock signal are included within a duration being associated with the second period of the rectangular wave,
wherein the sub scale clock signal generated by the clock generation unit has the second period being longer than the first period and shorter than a period twice the first period,
wherein the count number calculation unit sets, as the count number, a minimum value of a first value when a remainder of a division becomes zero,
wherein the division is defined by dividing a second value by a third value,
wherein the first value is a quotient of the division,
wherein the third value is a difference between the setting value and the first period, and
wherein the second value is a multiplicative period of a value of the first period by any natural number becomes zero.

2. The delay time detection circuit according to claim 1, wherein the sub scale signal generation unit generates, as a duration being associated with the second period, the sub scale signal having the rectangular wave for a duration coinciding with the second period.

3. The delay time detection circuit according to claim 1, wherein the sub scale signal generation unit includes
a clock reception unit configured to receive the sub scale clock signal from the clock generation unit,
a count signal reception unit configured to receive the count signal from the count unit, and
a sub scale signal output unit, equal in number to the count number, to supply the sub scale signal to the delay time calculation unit.

4. A stamping information generation device comprising:
the delay time detection circuit according to claim 1;
a timer that generates timer information, based on the system clock signal; and
an adder that:
calculates an additional value by adding the delay time and the timer information;
divides the additional value into an integral part and a decimal part; and
outputs each of the integral part and the decimal part.

5. The stamping information generation device according to claim 4, further comprising:
a time information generation unit configured to receive the integral part, and to generate time information, based on the received integral part; and a decimal retention unit configured to receive the decimal part, and to retain a value of the decimal part, wherein stamping information in which the time information and the value of the decimal part are added is output based on an input signal synchronized with the input clock signal.

6. A delay time detection method comprising:

a clock generation step of generating, based on a system clock signal corresponding to a main scale and having a first period, a sub scale clock signal having a second period differing from the first period;

a count step of generating a count signal while sequentially and repeatedly incrementing a preset count number, based on the sub scale clock signal;

a sub scale signal generation step of receiving the count signal, and generating sub scale signals, equal in number to the count number, that each have, at a rate of once in the count number, a rectangular wave for a duration being associated with the second period and that are shifted in timing relative to one another according to the second period;

a delay time calculation step of receiving an input clock signal having the first period, and calculating a delay time within a range of the first period of the input clock signal with respect to the system clock signal, based on one of the sub scale signals having a timing coinciding with the input clock signal among a plurality of the sub scale signals;

a count number calculation step of receiving a value of the second period as a setting value, and to determine the count number, based on the received setting value and the first period, wherein the delay time calculation step processes, as a timing coinciding with the input clock signal, either a case where two or more rising edges of the input clock signal are included within a duration being associated with the second period of the rectangular wave, or a case where two or more falling edges of the input clock signal are included within a duration being associated with the second period of the rectangular wave, wherein the sub scale clock signal generated by the clock generation step has the second period being longer than the first period and shorter than a period twice the first period, wherein the count number calculation unit step, as the count number, a minimum value of a first value when a remainder of a division becomes zero, wherein the division is defined by dividing a second value by a third value, wherein the first value is a quotient of the division, wherein the third value is a difference between the setting value and the first period, and wherein the second value is a multiplicative period of a value of the first period by any natural number.

* * * * *